United States Patent
Yang et al.

(10) Patent No.: US 9,257,434 B2
(45) Date of Patent: Feb. 9, 2016

(54) SEMICONDUCTOR DEVICE INCLUDING A RESERVOIR CAPACITOR

(71) Applicant: SK hynix Inc., Icheon (KR)

(72) Inventors: Seung Yeub Yang, Cheongju (KR); Jin Ho Kim, Seoul (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/520,105

(22) Filed: Oct. 21, 2014

(65) Prior Publication Data

US 2015/0348978 A1    Dec. 3, 2015

(30) Foreign Application Priority Data

May 28, 2014    (KR) ........................ 10-2014-0064515

(51) Int. Cl.
| | | |
|---|---|---|
| H01L 23/48 | (2006.01) | |
| H01L 27/10 | (2006.01) | |
| H01L 27/11 | (2006.01) | |
| H01L 31/00 | (2006.01) | |
| H01L 27/108 | (2006.01) | |
| H01L 23/522 | (2006.01) | |
| G01R 31/28 | (2006.01) | |
| H01L 21/66 | (2006.01) | |
| H01L 27/115 | (2006.01) | |

(52) U.S. Cl.
CPC ...... *H01L 27/10829* (2013.01); *G01R 31/2884* (2013.01); *H01L 23/5226* (2013.01); *H01L 22/34* (2013.01); *H01L 23/481* (2013.01); *H01L 27/10894* (2013.01); *H01L 27/10897* (2013.01); *H01L 27/11573* (2013.01); *H01L 2224/05095* (2013.01); *H01L 2225/06541* (2013.01); *H01L 2225/06596* (2013.01)

(58) Field of Classification Search
CPC . H01L 22/34; H01L 23/481; H01L 27/10894; H01L 27/10897; H01L 27/11573; H01L 2224/05095; H01L 2225/06541; H01L 2225/06596
See application file for complete search history.

(56) References Cited

U.S. PATENT DOCUMENTS

| | | | |
|---|---|---|---|
| 6,794,207 B2* | 9/2004 | Hasegawa et al. | 430/30 |
| 6,823,485 B1* | 11/2004 | Muranaka | 714/719 |
| 7,910,922 B2* | 3/2011 | Nishimura et al. | 257/50 |
| 8,953,394 B2* | 2/2015 | Jeon et al. | 365/189.14 |
| 8,994,145 B2* | 3/2015 | Sato | 257/532 |
| 2002/0041242 A1* | 4/2002 | Takahashi et al. | 341/120 |
| 2009/0278835 A1* | 11/2009 | Ka | 345/211 |
| 2010/0264822 A1* | 10/2010 | Aoki | 315/51 |
| 2013/0011968 A1 | 1/2013 | Bartley et al. | |
| 2013/0162282 A1* | 6/2013 | Hatakeyama et al. | 324/762.01 |
| 2013/0249578 A1* | 9/2013 | Yokou et al. | 324/750.3 |
| 2013/0307159 A1 | 11/2013 | Safran et al. | |
| 2014/0078848 A1* | 3/2014 | Hayashi et al. | 365/222 |
| 2014/0346516 A1* | 11/2014 | Lee et al. | 257/48 |

* cited by examiner

*Primary Examiner* — Ida M Soward

(57) ABSTRACT

A semiconductor device includes: a Through Silicon Via (TSV) region extending in a first direction and crossing a center portion of a semiconductor device; a plurality of cell regions disposed at both sides of the TSV region in a second direction crossing the first direction; a plurality of peripheral circuit regions each disposed between the TSV region and a corresponding cell region or between two neighboring cell regions in the first direction; a plurality of test pad regions each disposed at an edge portion of the semiconductor device and having a plurality of test pads, wherein the plurality of test pad regions encloses the cell regions, the peripheral circuit regions, and the TSV region; and a reservoir capacitor disposed below corresponding test pads in a test pad regions.

9 Claims, 4 Drawing Sheets

SEMICONDUCTOR DEVICE INCLUDING A RESERVOIR CAPACITOR

CROSS-REFERENCE TO RELATED APPLICATION

Priority to Korean Patent Application No. 10-2014-0064515 filed on 28 May 2014, the disclosure of which is hereby incorporated in its entirety by reference, is claimed.

BACKGROUND

Embodiments of the present disclosure relate to a semiconductor device, and more particularly to a semiconductor device including a reservoir capacitor.

Generally, a semiconductor device such as a DRAM includes a large number of small elements and generates an internal voltage to operate these elements. For example, various power sources are used to operate capacitors in a cell region and semiconductor elements in other regions that include a peripheral circuit region. When power sources supply voltages to the semiconductor elements, the supplied voltages may have unstable levels because of noise included therein. A reservoir capacitor may be used to reduce such noise and stabilize the supply of a power voltage and/or a ground voltage.

Typically, a reservoir capacitor is disposed in a peripheral circuit region of a semiconductor device and includes a plurality of Metal-Oxide-Semiconductor (MOS) transistors, each of which includes a gate, a source, and a drain. A source and a drain of a MOS transistor are electrically coupled to each other and form one end of a MOS capacitor so that the MOS transistor acts as the MOS capacitor.

A MOS capacitor includes a gate oxide film that has superior inner pressure characteristics when a voltage is applied to both ends of the MOS capacitor. Assuming that there is sufficient space for forming capacitors in a peripheral circuit region, MOS capacitors can be formed in the peripheral circuit region when MOS transistors are formed in a cell region. That is, the MOS capacitors disposed in the peripheral circuit region and the MOS transistors disposed in the cell region can be formed in the same process. Thus, a fabrication process of a semiconductor device can be simplified.

However, as the integration degree of a semiconductor device increases, the integration degree of the peripheral circuit region also increases. As a result, the size of a region in which a reservoir capacitor including a plurality of MOS capacitors can be formed is reduced. While a MOS capacitor has superior inner pressure characteristics for a voltage applied to both ends thereof, since a MOS capacitor has low electrostatic capacitance per unit area, it is difficult to use MOS capacitors as a reservoir capacitor in a highly-integrated semiconductor device.

SUMMARY

Various embodiments of the present disclosure are directed to a semiconductor device including a reservoir capacitor that addresses one or more issues of the related art.

An embodiment of the present disclosure relates to a highly integrated semiconductor device including a reservoir capacitor having a large capacity (e.g., µF-grade capacitance).

In accordance with an aspect of the present disclosure, a semiconductor device includes: a Through Silicon Via (TSV) region extending in a first direction and crossing a center portion of the semiconductor device; a plurality of cell regions disposed at both sides of the TSV region in a second direction crossing the first direction; a plurality of peripheral circuit regions, each disposed between the TSV region and a corresponding cell region or between two neighboring cell regions in the first direction; a plurality of test pad regions, each disposed at an edge portion of the semiconductor device and including a plurality of test pads, the plurality of test pad regions enclosing the cell regions, the peripheral circuit regions, and the TSV region; and a reservoir capacitor disposed below corresponding test pads in the test pad regions.

It is to be understood that both the foregoing general description and the following detailed description of embodiments are exemplary and explanatory.

DESCRIPTION OF EMBODIMENTS

Figure 1:
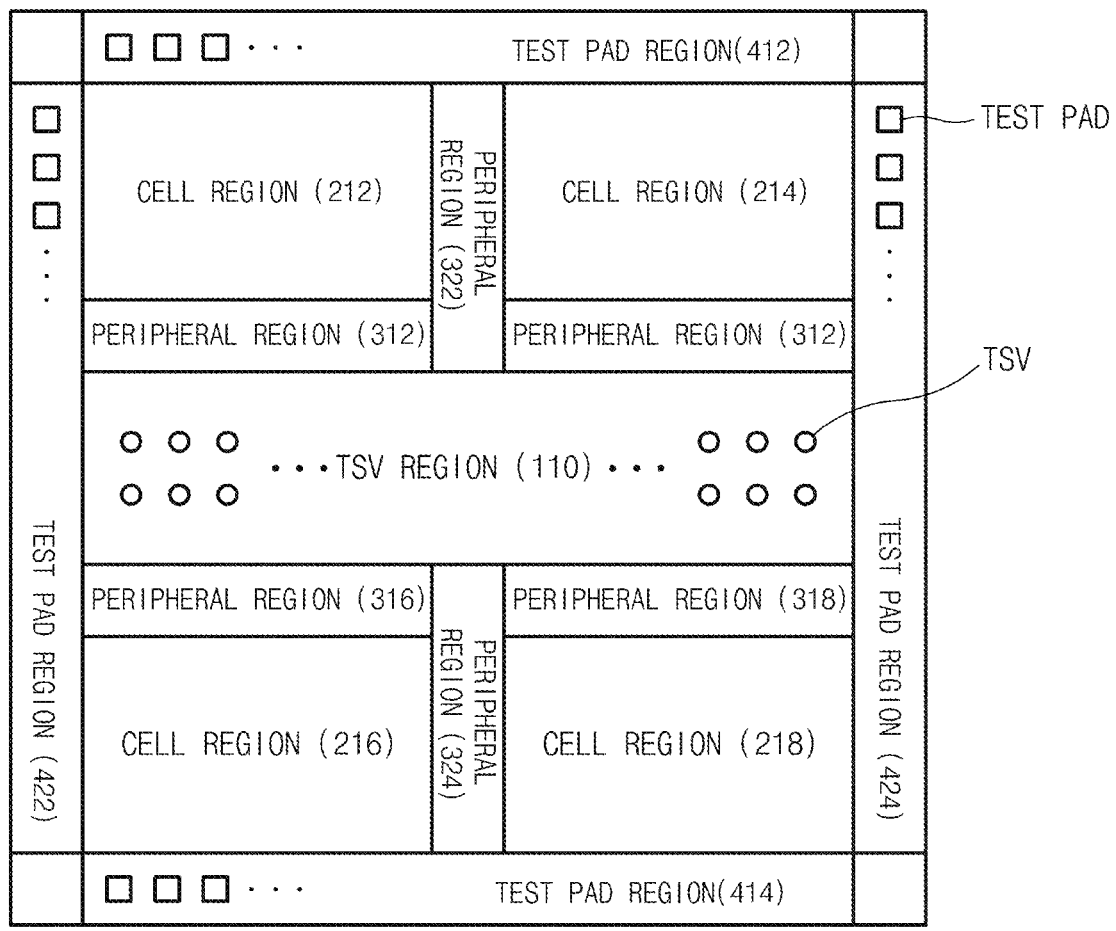
FIG. 1 illustrates a layout of a semiconductor device according to an embodiment of the present disclosure.

Reference will now be made in detail to certain embodiments, examples which are illustrated in the accompanying drawings. Wherever possible, the same reference numbers will be used throughout the drawings to refer to the same or like parts. In the following description, a detailed description of well-known configurations or functions may be omitted. Embodiments described in the specification and shown in the drawings are purely illustrative and are not intended to represent all aspects of the invention, such that various equivalents and modifications may be made without departing from the spirit of these embodiments.

FIG. 1 illustrates a layout of a semiconductor device according to an embodiment of the present disclosure.

Referring to FIG. 1, a Through Silicon Via (TSV) region 110, which includes a plurality of Through Silicon Vias (TSVs) to electrically interconnect stacked chips, extends in a first direction to cross a center portion of the semiconductor device (or semiconductor chip).

Cell regions 212, 214, 216, and 218 may be disposed at both sides of the TSV region 110 in a second direction crossing the first direction. For example, referring to FIG. 1, the TSV region 110 extends from left to right across a center portion of the semiconductor device, and cell regions 212, 214, 216, and 218 are arranged at either side of the TSV region 110 at the top and bottom of the figure. Peripheral circuit regions 312, 314, 316, and 318 may be disposed between the TSV region 110 and the cell regions 212, 214, 216, and 218, respectively. A peripheral circuit region 322 is disposed between the peripheral circuit regions 312 and 314 and between the cell regions 212 and 214. A peripheral circuit region 324 is disposed between the peripheral circuit regions 316 and 318 and between the cell regions 216 and 218.

A plurality of test pad regions 412, 414, 422, and 424 may enclose the cell regions 212, 214, 216, and 218, the peripheral circuit regions 312, 314, 316, 318, 322, and 324, and the TSV region 110 and may be disposed at edge portions of the semiconductor device. Each of the test pad regions 412, 414, 422, and 424 may include a plurality of test pads TEST PAD disposed in an array to test operations of the semiconductor device at a wafer level. In an embodiment, the test pads TEST PAD may contact probe card pins of a test device (not shown).

The test pad array disposed in the test pad regions 412, 414, 422, and 424 may be used to test the operations of the semiconductor device only at a wafer level. Thus, the test pad array may not be used after the semiconductor device is packaged. That is, the test pads TEST PAD disposed in the test pad regions 412, 414, 422, and 424 may not be wire-bonded when the semiconductor device is packaged. In addition, the test pad regions 412, 414, 422, and 424 may not be used when the semiconductor device is in a product.

Therefore, in some embodiments of the present disclosure, reservoir capacitors may be disposed below the test pad arrays in the test pad regions 412, 414, 422, and 424. In an embodiment, a reservoir capacitor includes a plurality of cell reservoir capacitors, each of which has substantially the same structure as a cell capacitor disposed in a unit cell of the cell regions 212, 214, 216, and 218.

Figure 2:
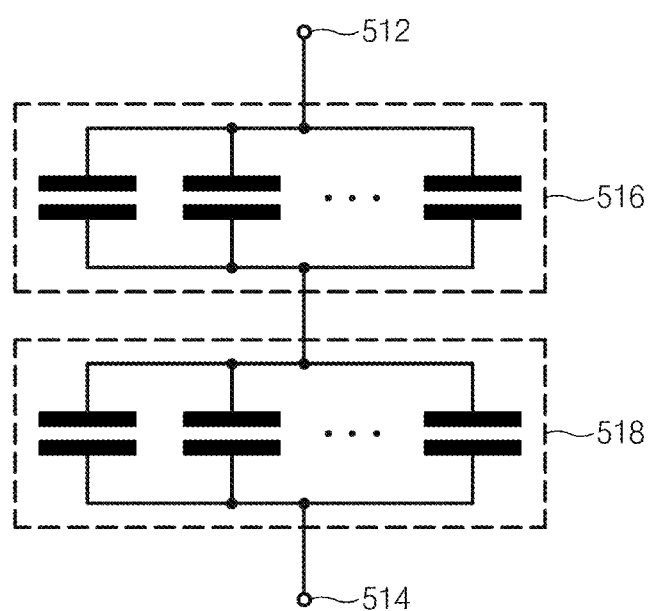
FIG. 2 illustrates reservoir capacitors according to embodiments of the present disclosure.
Figure 3:
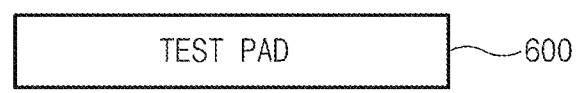
FIG. 3 illustrates a cell reservoir capacitor suitable for use in the reservoir capacitors of FIG. 2 according to an embodiment the present disclosure.
Figure 3:
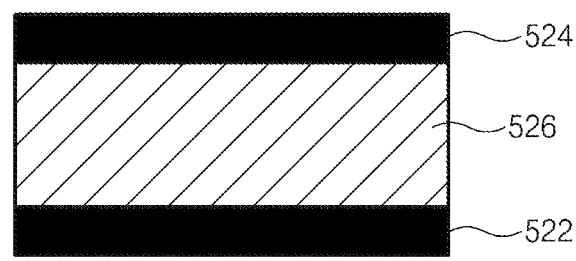
Figure 3:
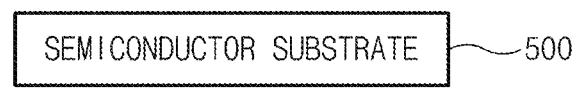

FIG. 2 illustrates reservoir capacitors according to embodiments of the present disclosure. FIG. 3 illustrates a cell reservoir capacitor of a reservoir capacitor according to an embodiment of the present disclosure.

Referring to FIG. 2, a reservoir capacitor includes a first capacitor group (or a first plurality of cell reservoir capacitors) 516 and a second capacitor group (or a second plurality of cell reservoir capacitors) 518, which are coupled in series between a first power-supply source 512 and a second power supply source 514. For example, as shown in FIG. 2, a first terminal of the first capacitor group 516 is coupled to the first power supply source 512, and a second terminal of the first capacitor group 516 is coupled to a first terminal of the second capacitor group 518. A second terminal of the second capacitor group 518 is coupled to the second power supply source 514. In an embodiment, the first power supply source 512 may be a power voltage supply source, and the second power supply source 514 may be a ground voltage supply source.

Each of the first capacitor group 516 and the second capacitor group 518 may include a plurality of cell reservoir capacitors coupled in parallel to each other. A cell reservoir capacitor included in any of the first capacitor group 516 and the second capacitor group 518 may have a structure that is substantially identical to that of a cell capacitor included in a unit cell of the cell regions 212, 214, 216, and 218, and may also be formed at the same time the cell capacitor is formed.

Referring to FIG. 3, a cell reservoir capacitor included in any of the first and second capacitor groups 516 and 518 may be disposed between a semiconductor substrate 500 and a test pad 600. In this case, the test pad 600 may be disposed in any of the test pad regions 412, 414, 422, and 424, as shown in FIG. 1. Each cell reservoir capacitor may include a stacked structure having a first conductive layer 522, a dielectric layer 526, and a second conductive layer 524. In an embodiment, each of the first conductive layer 522 and the second conductive layer 524 may be a thin film of polysilicon or metal. The dielectric layer 526 may include a material having a high dielectric constant (high permittivity) or a ferroelectric material. Although a flat-type cell reservoir capacitor is shown in FIG. 3 for convenience of description and to enhance understanding, it would be obvious to those skilled in the art that the cell reservoir capacitor can have any of various shapes, such as a cylindrical or pillar shape, based on the present disclosure and the teachings provided herein.

The cell reservoir capacitor may be a large-capacity capacitor, which has $\mu F$-grade capacitance, and may have substantially the same capacitance value as that of a cell capacitor of a unit cell. In an embodiment, the cell reservoir capacitor has a capacitance value in a range from about 1 $\mu F$ to about 9 $\mu F$.

Referring back to FIG. 2, although FIG. 2 shows two capacitor groups 516 and 518 coupled in series to each other for convenience of description, embodiments of the present disclosure are not limited thereto. In some embodiments, three or more capacitor groups may be coupled in series to one another.

The first power supply source 512 may be coupled to the first capacitor group 516 through a conductive line e.g., a first metal line, and the second power supply source 514 may be coupled to the second capacitor group 518 through a conductive line, e.g., a second metal line. On the other hand, a semiconductor device on which the test operation is performed may not include the first metal line for interconnecting the first power supply source 512 and the first capacitor group 516, and the second metal line for interconnecting the second power supply source 514 and the second capacitor group 518. That is, the semiconductor device to be tested may not electrically interconnect the first power supply source 512 and the first capacitor group 516 and/or the second power supply source 514 and the second capacitor group 518. As a result, the semiconductor device may be open between the first power supply source 512 and the first capacitor group 516 and/or between the second power supply source 514 and the second capacitor group 518. Thus, the semiconductor device can prevent the first power supply source 512 and the second power supply source 514 from being short-circuited by excessive contact of a probe card pin during the test operation.

A large-capacity (e.g., $\mu F$-grade) capacitor such as the cell reservoir capacitors of FIG. 2 may have a high Equivalent Series Resistance (ESR). Although such a large-capacity capacitor can effectively reduce a low-frequency noise, it may be difficult to reduce a high-frequency noise using only cell reservoir capacitors. Therefore, in an embodiment, cell reservoir capacitors (e.g., $\mu F$-grade capacitors) and MOS capacitors (e.g., nF-grade capacitors) may be implemented together to effectively reduce high-frequency noise as well as low-frequency noise.

Figure 4:
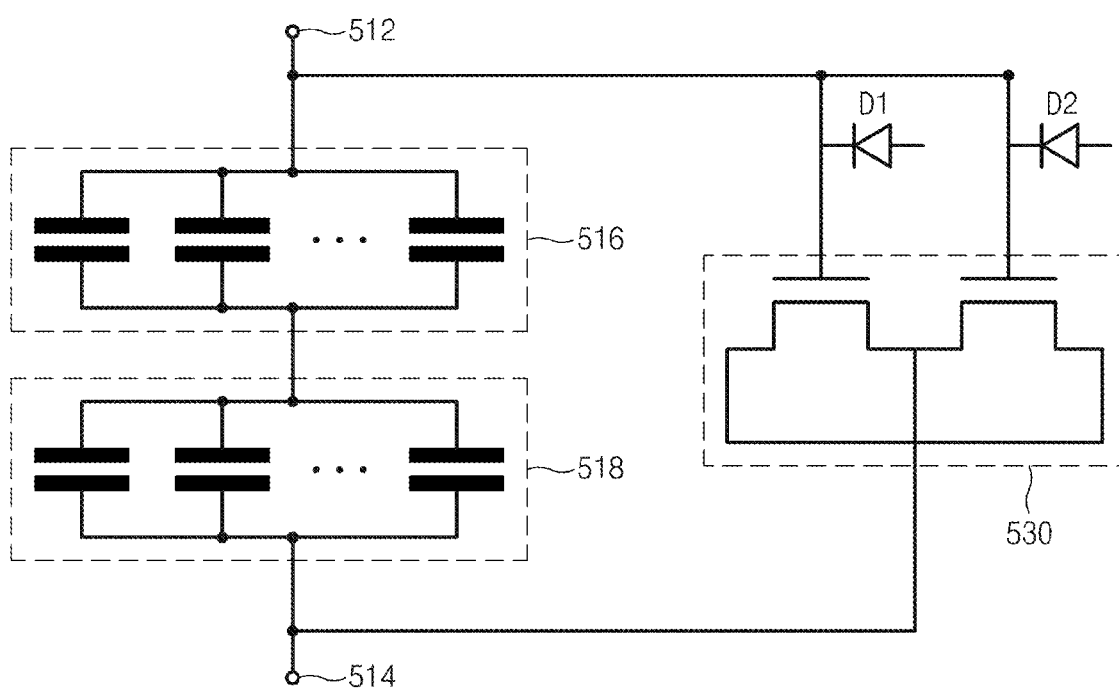
FIG. 4 is a circuit diagram illustrating a reservoir capacitor according to an embodiment of the present disclosure.

FIG. 4 is a circuit diagram illustrating a reservoir capacitor according to an embodiment of the present disclosure. FIG. 4 shows a reservoir capacitor that includes first and second pluralities of cell reservoir capacitors 516 and 518 and a plurality of MOS capacitors 530.

In addition to a configuration of the reservoir capacitor shown in FIG. 2, the reservoir capacitor of FIG. 4 includes the plurality of MOS capacitors 530, which is coupled in parallel to the reservoir capacitor of FIG. 2. The reservoir capacitor of FIG. 4 may further include a plurality of gate protection diodes D1 and D2 respectively coupled to gates of the MOS capacitors 530. The plurality of MOS capacitors 530 may be disposed over an active region of a semiconductor substrate in the test pad regions 412, 414, 422, and 424, and may be disposed below the cell reservoir capacitors 516 and 518. The above-mentioned MOS capacitors 530 may have a capacitance value in a range from about 1 nF to about 9 nF.

Embodiments of the present disclosure form a plurality of cell reservoir capacitors each having $\mu F$-grade capacitance in a semiconductor device, without substantially increasing the chip size. As a result, these embodiments can be used in a Power Distribution Network (PDN) of High Bandwidth Memory (HBM) products to which Through Silicon Vias (TSVs) are applied.

Those skilled in the art will appreciate that embodiments of the present disclosure may be carried out in other ways than those set forth herein without departing from the spirit and essential characteristics of these embodiments. The above embodiments are therefore to be construed in all aspects as illustrative and not restrictive.

The above embodiments of the present disclosure are illustrative and not limitative. Various alternatives and equivalents are possible. Nor are embodiments limited to any specific type of semiconductor devices. For example, embodiments may be implemented in a volatile memory device, such as a dynamic random access memory (DRAM) device, or a non-volatile memory device. Other additions, subtractions, or modifications are obvious in view of the present disclosure and are intended to fall within the scope of the appended claims.

What is claimed is:

1. A semiconductor device comprising:
    a Through Silicon Via (TSV) region extending in a first direction and crossing a center portion of the semiconductor device;
    a plurality of cell regions disposed at both sides of the TSV region in a second direction crossing the first direction;
    a plurality of peripheral circuit regions, each disposed between the TSV region and a corresponding cell region or between two neighboring cell regions in the first direction;
    a plurality of test pad regions, each disposed at an edge portion of the semiconductor device and including a plurality of test pads, the plurality of test pad regions enclosing the cell regions, the peripheral circuit regions, and the TSV region; and
    a reservoir capacitor disposed below corresponding test pads in the test pad regions.

2. The semiconductor device according to claim 1, wherein the reservoir capacitor includes:
    a first capacitor group and a second capacitor group, which are coupled to each other in series and disposed in series between a first power supply source and a second power supply source.

3. The semiconductor device according to claim 2, wherein the first capacitor group and the second capacitor group include a first plurality of cell reservoir capacitors and a second plurality of cell reservoir capacitors, respectively, the first plurality of cell reservoir capacitors being coupled in parallel to each other, the second plurality of cell reservoir capacitors being coupled in parallel to each other.

4. The semiconductor device according to claim 3, wherein each of the cell reservoir capacitors is substantially identical in structure to a cell capacitor disposed in a cell region.

5. The semiconductor device according to claim 4, wherein each of the cell reservoir capacitors has a µF-grade capacitance value.

6. The semiconductor device according to claim 3, wherein the reservoir capacitor further comprises:
    a Metal-Oxide-Semiconductor (MOS) capacitor coupled between the first power supply source and the second power supply source.

7. The semiconductor device according to claim 6, wherein the reservoir capacitor further comprises:
    a gate protection diode coupled to a gate of the MOS capacitor.

8. The semiconductor device according to claim 6, wherein the MOS capacitor has a nF-grade capacitance value.

9. The semiconductor device according to claim 1, wherein the reservoir capacitor includes: a first capacitor group and a second capacitor group, which are coupled to each other in series and disposed between a first power supply source and a second power supply source, and
    wherein the first capacitor group and the second capacitor group are electrically separate from the first power supply source and the second power supply source, respectively.

* * * * *